(12) United States Patent
Cong

(10) Patent No.: US 10,754,263 B2
(45) Date of Patent: Aug. 25, 2020

(54) DEVICE FOR MOVING WORKPIECE PLATFORM

(71) Applicant: SHANGHAI MICRO ELECTRONICS EQUIPMENT (GROUP) CO., LTD., Shanghai (CN)

(72) Inventor: Guodong Cong, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/338,660

(22) PCT Filed: Sep. 26, 2017

(86) PCT No.: PCT/CN2017/103335
§ 371 (c)(1),
(2) Date: Apr. 1, 2019

(87) PCT Pub. No.: WO2018/059377
PCT Pub. Date: Apr. 5, 2018

(65) Prior Publication Data
US 2020/0012203 A1 Jan. 9, 2020

(30) Foreign Application Priority Data
Sep. 30, 2016 (CN) .......................... 2016 1 0873647

(51) Int. Cl.
*G03B 27/42* (2006.01)
*G03F 7/20* (2006.01)
*H01L 21/027* (2006.01)

(52) U.S. Cl.
CPC ...... *G03F 7/70975* (2013.01); *G03F 7/70716* (2013.01); *G03F 7/70733* (2013.01); *G03F 7/70758* (2013.01); *H01L 21/0274* (2013.01)

(58) Field of Classification Search
CPC ............. G03F 7/70975; G03F 7/70716; G03F 7/70733; G03F 7/70758; H01L 21/0274
See application file for complete search history.

(56) References Cited

U.S. PATENT DOCUMENTS 6,639,654 B2   10/2003   Binnard et al.

FOREIGN PATENT DOCUMENTS

CN   2173231 Y   8/1994
CN   101017331 A   8/2007
(Continued)

OTHER PUBLICATIONS

CN 101609263A English translation by Google, Dec. 2009.*
(Continued)

*Primary Examiner* — Peter B Kim
(74) *Attorney, Agent, or Firm* — Muncy, Geissler, Olds & Lowe, P.C.

(57) ABSTRACT

A device for moving a workpiece platform is provided, comprising a bottom frame (1) for supporting the workpiece platform, a pneumatic spring (2) disposed on a lower surface of the bottom frame (1), an air cushion unit (3) for generating flotation to support the workpiece platform when the workpiece platform is being moved, and a moving unit (200) disposed on the bottom frame (1). The moving unit (200) comprises: a roller unit (4), for driving the workpiece platform to move; a leaf spring (6), wherein one end of the leaf spring (6) is connected to a connecting block (5), and the other end thereof is connected to the roller unit (4); and a leaf spring deformation drive unit (8), connected to the leaf spring (6), to enable, by driving the leaf spring (6) to deform, the roller unit (4) to be in contact with the ground when the workpiece platform is being moved. The leaf spring deformation drive unit (8) is disposed such that the leaf spring (6) deforms, and the roller unit (4) is in contact with the ground (Continued)

when the workpiece platform is being moved in or out, driving the workpiece platform to move, preventing jamming in case of extremely high torque, and improving stability when the workpiece platform is being moved.

12 Claims, 4 Drawing Sheets

(56) References Cited

FOREIGN PATENT DOCUMENTS

| | | | |
|---|---|---|---|
| CN | 101209795 A | 7/2008 | |
| CN | 101609263 A | 12/2009 | |
| CN | 100579887 C | 1/2010 | |
| CN | 102830591 A | 12/2012 | |
| CN | 102962256 A | 3/2013 | |
| CN | 104045019 A | 9/2014 | |
| JP | 2005347526 A | 12/2005 | |
| WO | WO-2018219217 A1 * | 12/2018 | ............ G03F 7/20 |

OTHER PUBLICATIONS

CN 101209795A English translation by Google, Jul. 2008.*
Office Action dated Jun. 15, 2020 in JP Application No. 2019515898.

* cited by examiner

DEVICE FOR MOVING WORKPIECE PLATFORM

TECHNICAL FIELD

The present invention relates to the field of photolithography machines and, in particular, to a device for move-in and move-out of a workpiece stage.

BACKGROUND

Workpiece stages in various photolithography machines need to be moved out from the photolithography machines for maintenance or repair after a certain period of running or upon malfunctioning and then moved into the photolithography machines after the maintenance or repair. In order to shorten the time required for maintenance or repair and ensure the safety of the equipment when it is moved in and out, automation of the move-in and move-out process is desirable.

Most existing move-in and move-out devices are slider-crank mechanisms with hinges that are not coplanar due to space constraints. This may lead to excessive torques at the hinges, which can make the mechanisms susceptible to jamming. Moreover, most of the conventional mechanisms are usually used alone, tending to exert an excessive pressure onto the ground. For this reason, it is possible for them to lean or even tip over. In such a situation, the workpiece stage loaded on the mechanism may drop off, leading to failure of the move-in and move-out process.

SUMMARY OF THE INVENTION

The above-described problems with the conventional technique are solved by a device for move-in and move-out of a workpiece stage according to the present invention.

The device includes a base frame for supporting the workpiece stage, a gas spring disposed on a lower surface of the base frame, a gas-cushion unit for producing a gas cushion that supports the workpiece stage during movement of the workpiece stage, and a move-in and move-out unit attached to the base frame, the move-in and move-out unit including:

a wheel assembly for driving the workpiece stage to move;

a flat spring having a first end coupled to the base frame and a second end coupled to the wheel assembly; and a spring deflection assembly which is coupled to the flat spring and configured to deflect the flat spring to bring the wheel assembly into contact with ground during the movement of the workpiece stage.

Additionally, the wheel assembly may include a bracket coupled to the second end of the flat spring, a wheel provided on the bracket and a motor connected to the wheel.

Additionally, the device may further include a connecting block secured to the base frame, the first end of the flat spring being coupled to the base frame via the connecting block, wherein a hook block is disposed between the flat spring and the connecting block, the hook block having a base fixed to the flat spring and a top provided with a hook, the hook hooking on the connecting block.

Additionally, the connecting block may be provided with a pocket matching the hook, and the hook is received in the pocket.

Additionally, the flat spring may have a two-section structure that includes two sections joined to each other by a flexible hinge.

Additionally, the spring deflection assembly may be disposed in positional correspondence with the wheel assembly.

Additionally, the spring deflection assembly may include a pneumatic cylinder fixed to the flat spring, a retractable piston rod received in the pneumatic cylinder and gas pipes communicating with an interior of the pneumatic cylinder.

Additionally, the gas pipes may be provided with a pressure regulator.

Additionally, an urging roller may be provided on top of the piston rod.

Additionally, the spring deflection assembly may further include a support bracket which is fixed to the base frame and configured to support the urging roller.

Additionally, two move-in and move-out units may be provided and are arranged along a horizontal line and disposed in symmetry to each other under the base frame along a move-in and move-out direction for the workpiece stage.

Additionally, the move-in and move-out unit may be provided on an edge of the base frame in a move-in and move-out direction for the workpiece stage.

Additionally, four move-in and move-out units may be provided and disposed symmetrically along a move-in and move-out direction for the workpiece stage at four corners of the lower surface of the base frame.

As noted above, the device for move-in and move-out of a workpiece stage of the present invention includes the base frame for supporting the workpiece stage, the gas spring disposed on the lower surface of the base frame, the gas-cushion unit for producing a gas cushion that supports the workpiece stage during movement thereof and the move-in and move-out unit attached to the base frame. The move-in and move-out unit includes: the wheel assembly for driving the workpiece stage; the connecting block fixed to the base frame; the flat spring coupled to the connecting block at one end and to the wheel assembly at the other end; and the spring deflection assembly coupled to the flat spring and configured to deflect the flat spring to bring the wheel assembly into contact with the ground to enable movement of the workpiece stage. The spring deflection assembly in the move-in and move-out unit can deflect the flat spring to bring the wheel assembly into contact with the ground to enable movement of the workpiece stage. After the workpiece stage has moved into place, the wheel assembly can be released from contact with the ground in order to avoid affecting normal operation of the workpiece stage. In this way, jamming due to an excessive torque can be prevented.

In these figures: 1—base frame; 200—move-in and move-out unit; 2—gas spring; 3—gas-cushion unit; 4—wheel assembly; 41—bracket; 42—wheel; 5—connecting block; 6—flat spring; 61—flexible hinge; 7—hook block; 71—hook; 8—spring deflection assembly; 81—pneumatic cylinder; 82—piston rod; 83—urging roller; 84—retracting pipe; 85—advancing pipe; 86—pressure regulator; 87—gas intake pipe; 88—support bracket; 9—ground.

DETAILED DESCRIPTION

The invention will be described in detail below with reference to the accompanying drawings.

Embodiment 1

Figure 1:
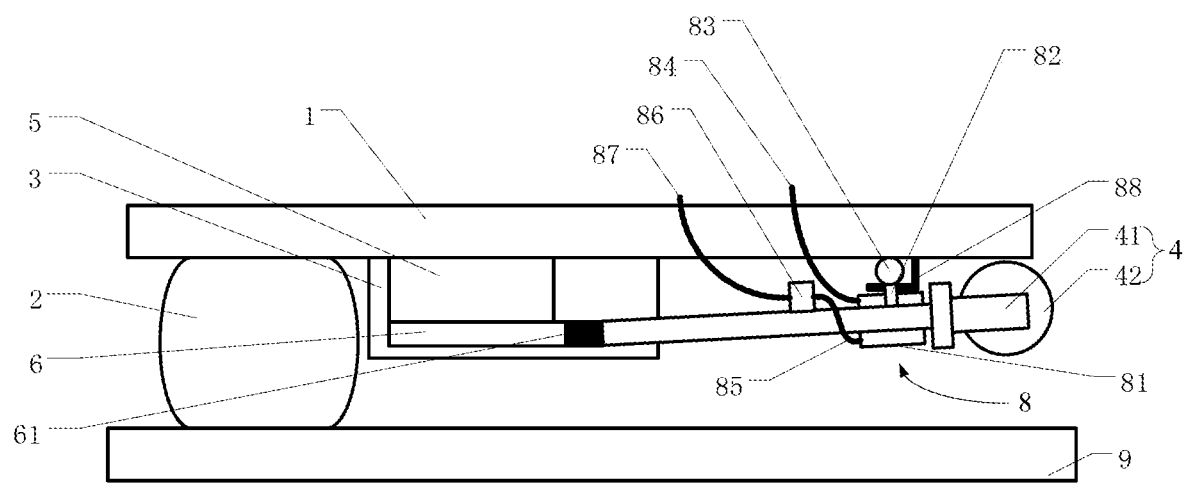
FIG. 1 is a schematic illustration of a device for move-in and move-out of a workpiece stage according to a first embodiment of the present invention.

As shown in FIG. 1, a device for move-in and move-out of a workpiece stage according to the present invention includes: a base frame 1 for supporting the workpiece stage; a gas spring 2 disposed on a lower surface of the base frame 1; a gas-cushion unit 3 for producing a gas cushion that supports the workpiece stage during movement of the workpiece stage; and a move-in and move-out unit 200 attached to the base frame 1.

The move-in and move-out unit 200 includes a wheel assembly 4 for driving the workpiece stage. In this embodiment, the wheel assembly 4 is disposed under the base frame 1 in order to move the workpiece stage out of a main frame of a photolithography machine to receive maintenance and move it therein after the completion of the maintenance.

The move-in and move-out unit further includes a connecting block 5 fixed to the base frame 1. A flat spring 6 is mounted on the connecting block 5.

Figure 2:
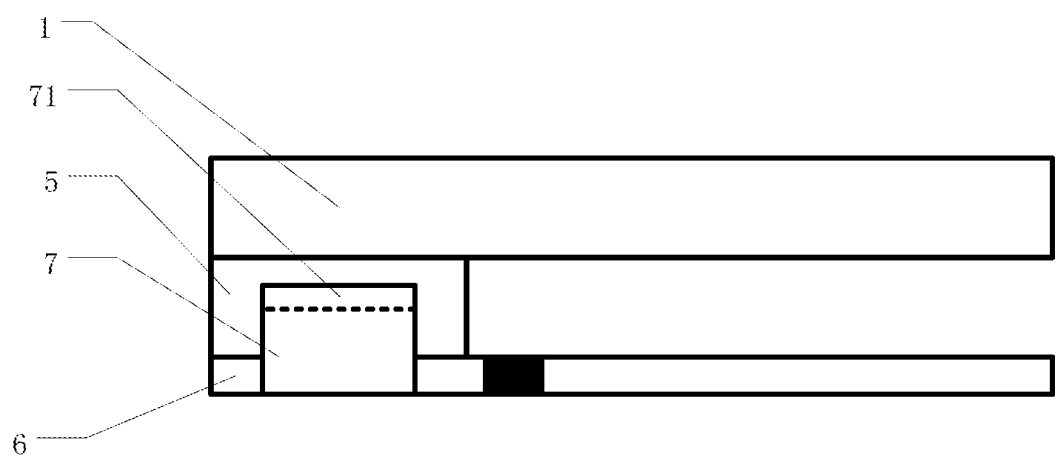
FIG. 2 is a front elevation view showing the coupling between a connecting block and a flat spring according to the first embodiment of the present invention.
Figure 3:
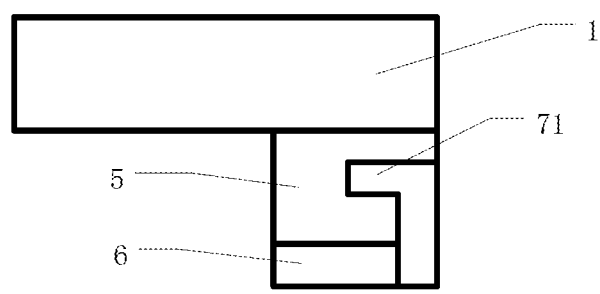
FIG. 3 is a side view showing the coupling between the connecting block and the flat spring according to the first embodiment of the present invention.

The flat spring 6 is coupled to the connecting block 5 at one end. As shown in FIGS. 2 to 3, a hook block 7 is arranged between the flat spring 6 and the connecting block 5. The hook block 7 has a base fixed to the flat spring 6 and a top thereof is provided with a hook 71. The hook 71 is hooked on the connecting block 5. The connecting block 5 is provided with a pocket matching the hook 71. The hook 71 is hooked in the pocket for anchoring between the hook and the pocket. The other end of the flat spring 6 is coupled to the wheel assembly 4.

The move-in and move-out unit further includes a spring deflection assembly 8 which is coupled to the flat spring 6 and configured to deflect the flat spring 6 to bring the wheel assembly 4 into contact with the ground to enable movement of the workpiece stage. Specifically, the workpiece stage is allowed to move when the wheel assembly 4 comes into contact with the ground 9. After the workpiece stage has moved into place, the wheel assembly 4 can be released from contact with the ground 9 in order to avoid affecting normal operation of the workpiece stage. In this way, jamming will not happen during move-in and move-out of the workpiece stage due to an excessive torque. With continued reference to FIG. 1, the wheel assembly 4 includes a bracket 41 coupled to the other end of the flat spring 6, a wheel 42 provided on the bracket 41 and a motor (not shown) connected to the wheel 42. The bracket 41 is provided at the end of the flat spring 6 opposing to the connecting block 5 so as to fix the wheel 42 relative to the flat spring 6. The motor is configured to cause the wheel 42 contacting the ground 9 with sufficient friction therebetween to rotate to accomplish move-in and move-out of the workpiece stage.

Figure 4:
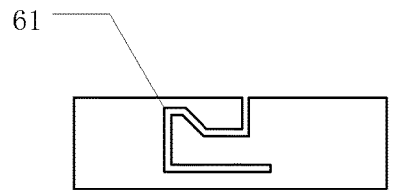
FIG. 4 is a detailed schematic illustration of a flexible hinge according to the first embodiment of the present invention.

Preferably, the flat spring 6 has two sections joined to each other by a flexible hinge 61. FIG. 4 shows a particular configuration of the flexible hinge 61, which allows elastic deflection of the flat spring 6 thereat while providing the flat spring 6 with sufficient resilience for it to spring back. Moreover, it also has an upper hook portion which can prevent the flat spring 6 from bending too much to cause yield failure. Of course, the flexible hinge 61 may be replaced by another hinge in the form of a bearing, shaft or the like, as long as the above function is realized.

Referring back to FIG. 1, the spring deflection assembly 8 is disposed in positional correspondence with the wheel assembly 4. The spring deflection assembly 8 includes a pneumatic cylinder 81 fixed to the flat spring 6, a retractable piston rod 82 received in the pneumatic cylinder 81, an urging roller 83 provided on top of the piston rod 82 and two gas pipes both communicating with the interior of the pneumatic cylinder 81, including a retracting pipe 84 and an advancing pipe 85. The urging roller 83 is brought into contact with the base frame 1 and is configured to transfer a force from the pneumatic cylinder 81 to the base frame 1 so that the flat spring 6 is deflected under the action of a reaction of the base frame 1 to the spring deflection assembly 8. Meanwhile, the urging roller 83 can further reduce the friction between the piston rod 82 and the base frame 1 and the urging roller 83 can rotate to counteract vibration arising from the advancement and retraction of the piston rod 82. When a gas is introduced from the advancing pipe 85, the piston rod 82 is pushed upward so that the urging roller 83 is raised and exerts a force on the base frame 1 and the flat spring 6 is deflected downward under the effect of a reaction to the force. As a result, when the wheel 42 comes into contact with the ground 9 and presses the ground 9, producing static friction therebetween. When a gas is introduced from the retracting pipe 84, the piston rod 82 will be retracted and the urging roller 83 will no longer press the base frame 1. As a result, the flat spring 6 springs back and the wheel 42 is separated from the ground 9. The gas pipes may be provided with a pressure regulator 86. The pressure regulator 86 is coupled to a gas intake pipe 87. With the wheel 42 in contact with the ground 9, the pressure regulator 86 is able to adjust the pressure on the around 9 from the wheel 42 to make the wheel 42 generate sufficient pressure on the ground 9, thereby generating desired static friction for driving the movement of the workpiece stage. The pressure regulator 86 is also able to prevent the workpiece stage from tipping over due to an excessive pressure of the wheel 42 on the ground 9. The spring deflection assembly 8 also includes a support bracket 88 fixed to the base frame 1, the support bracket 88 is configured to support the urging roller 83. When the piston rod 82 is advanced, the support bracket 88 lifts the urging roller 83 to exert a force on the base frame 1. This allows the force to affect a large area, leading to an increase in stability. In this embodiment, when viewed in the direction of gravity, the flexible hinge 61, the urging roller 83 and the wheel 42 have their centers of effort or force substantially aligned along the same axis. This can ensure the balance of forces, thereby further avoiding the occurrence of jamming.

Figure 5:
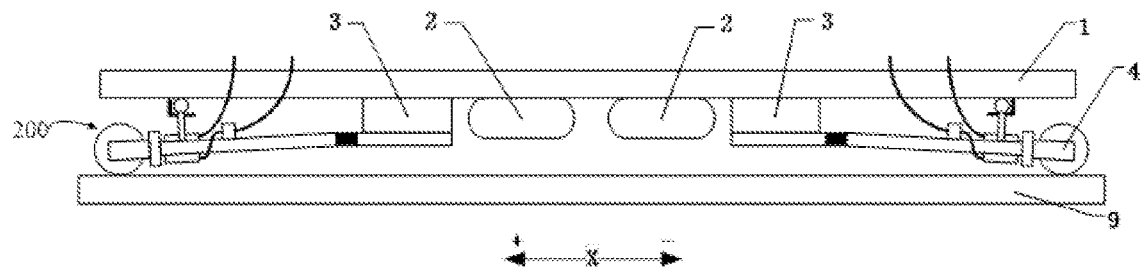
FIG. 5 schematically illustrates how two move-in and move-out units are distributed in accordance with the first embodiment of the present invention.

As shown in FIG. 5, two move-in and move-out units 200 may be provided in symmetry with each other under and with respect to the base frame 1 along the horizontal move-in and move-out direction of the workpiece stage. In this embodiment, the two move-in and move-out units 200 are shown to be arranged in symmetry with each other along the X axis. This structure can effectively distribute the pressure acting on the ground and allow the workpiece stage to be supported and moved along the X axis with higher stability.

In the move-in and move-out process for the workpiece stage using the device for move-in and move-out of a workpiece stage as defined above, the base frame 1 is respectively supported by the gas spring 2, the gas-cushion unit 3 and the wheel assembly 4 at different times. The process may specifically include the following steps.

Figure 6:
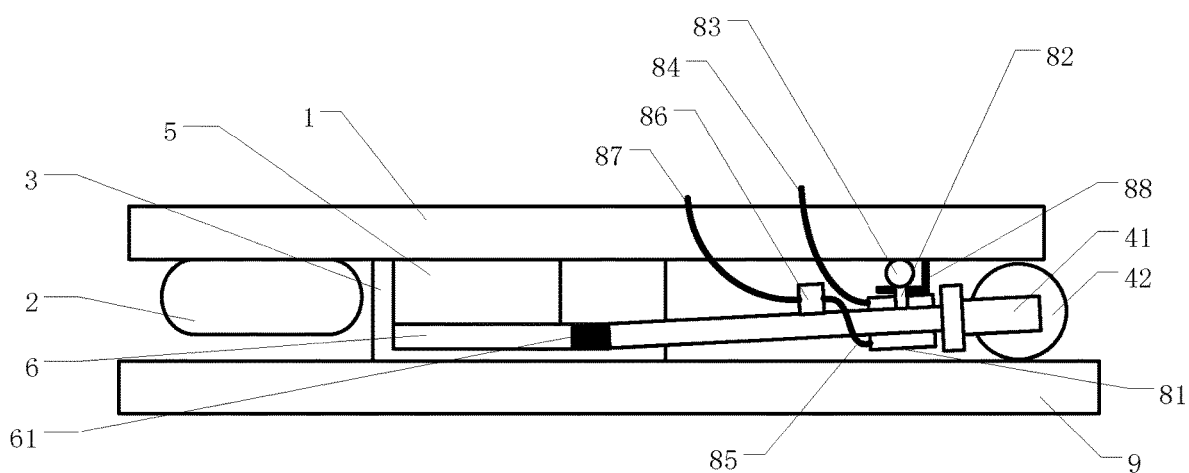
FIG. 6 schematically illustrates the device for move-in and move-out of a workpiece stage according to the first embodiment of the present invention when a gas spring therein contracts.

In step S1, the gas spring 2 contracts, and the gas-cushion unit 3 is activated to generate a gas cushion (at this point, the base frame 1 is supported by the gas-cushion unit 3). The spring deflection assembly 8 exerts a force on the base frame 1, and the flat spring 6 is consequently deflected downward, bringing the wheel assembly 4 into contact with the ground 9. Specifically, as shown in FIG. 6, a gas is introduced into the advancing pipe 85 in the spring deflection assembly 8 so that the piston rod 82 is raised to exert a force to the base frame 1 via the urging roller 83. A reaction to this force deflects the flat spring 6 downward to bring the wheel 42 in the wheel assembly 4 into contact with the ground 9, resulting in static friction therebetween (the base frame 1 is supported by the gas-cushion unit 3 throughout this process and additionally by the wheel assembly 42 after the wheel assembly 42 comes into contact with the ground).

Figure 7:
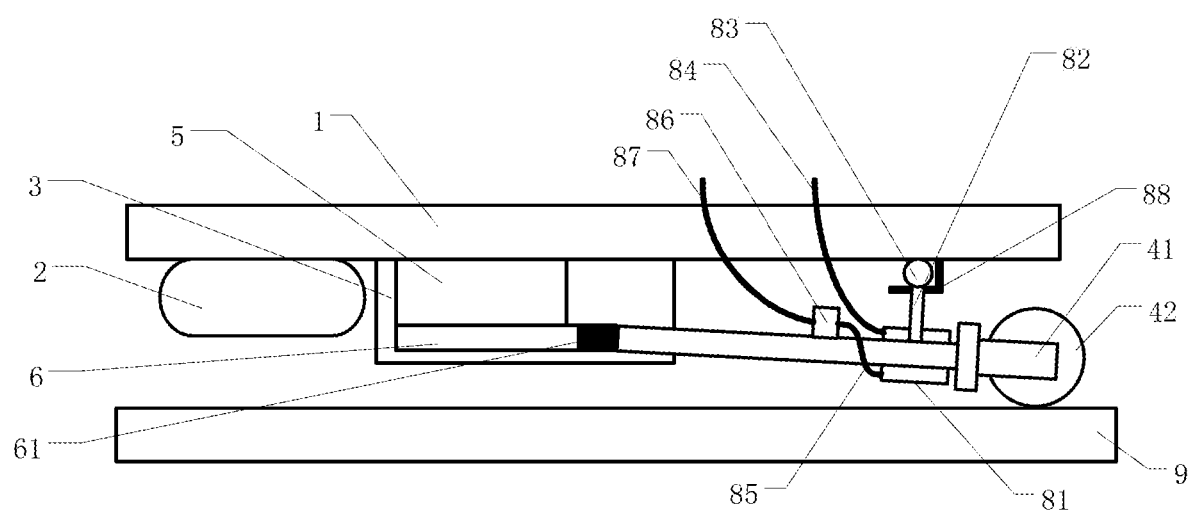
FIG. 7 schematically illustrates the device for move-in and move-out of a workpiece stage according to the first embodiment of the present invention when the workpiece stage is levitated by a gas cushion generated by a gas-cushion unit.

In step S2, with the flat spring 6 continuing to be deflected downward, the gas-cushion unit 3 is lifted (at this point, the base frame 1 is still supported mainly by the gas-cushion unit 3 and secondarily by the wheel assembly 4). The wheel assembly 4 then drives the workpiece stage to move out. That is, the motor drives the wheel 42 to rotate, causing move-out of the workpiece stage, as shown in FIG. 7. During move-out of the workpiece stage, the pressure on the ground 9 from the wheel 42 may be adjusted using the pressure regulator 86 to make the wheel 42 generate sufficient pressure on the ground 9, thereby generating static friction required to cause the movement of the workpiece stage. The pressure regulator 86 is also able to prevent the workpiece stage from tipping over due to an excessive pressure of the wheel 42 on the ground 9.

In step S3, subsequent to maintenance of the workpiece stage, the wheel assembly 4 drives the workpiece stage to move back. Similarly, during move-in of the workpiece stage, the pressure on the ground 9 from the wheel 42 may be adjusted using the pressure regulator 86 to make the wheel 42 generate sufficient pressure on the ground 9, thereby generating static friction required to cause the movement of the workpiece stage. The pressure regulator 86 is also able to prevent the workpiece stage from tipping over due to an excessive pressure of the wheel 42 on the ground 9 workpiece stage.

In step S4, once the workpiece stage has moved into place, the gas spring 2 expands, releasing the force on the base frame 1 from the spring deflection assembly 8. The flat spring 6 springs back (at this point, the base frame 1 is supported by the gas spring 2), and the workpiece stage on the base frame 1 can operate normally. Specifically, a gas is introduced through the retracting pipe 84 in the spring deflection assembly 8 and the piston rod 82 retracts and separates from the base frame 1. That is, during normal operation of the workpiece stage, the move-in and move-out units 200 are stowed and not in use.

Embodiment 2

Figure 8:
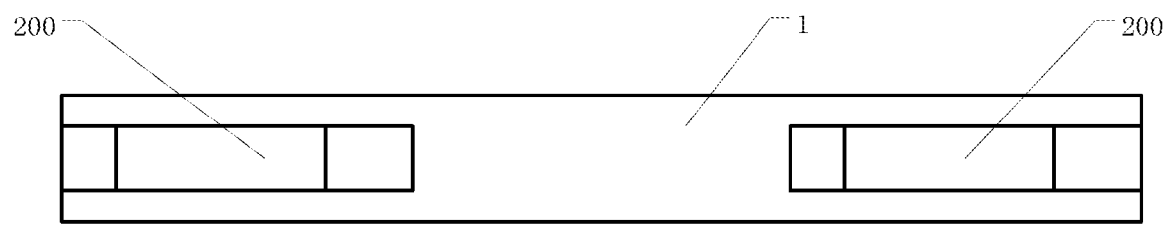
FIG. 8 schematically shows how move-in and move-out units are distributed in accordance with a second embodiment of the present invention.

As shown in FIG. 8, this embodiment differs from Embodiment 1 in that move-in and move-out units 200 are provided on two edge of the base frame 1 extending in the move-in and move-out direction for the workpiece stage, with the urging roller 83 in contact with the main frame of the photolithography machine. As illustrated, two move-in and move-out units 200 are included, and each of the move-in and move-out units 200 is provided on a corresponding one of the edges of the base frame 1 extending along the X axis. This arrangement is more stable because it can completely avoid the workpiece stage from tipping over due to an excessive pressure on the ground 9 from the wheel 42. The number of the move-in and move-out units 200 is not limited to two, and in each case, they are provided on the two edges of the base frame 1.

Embodiment 3

Figure 9:
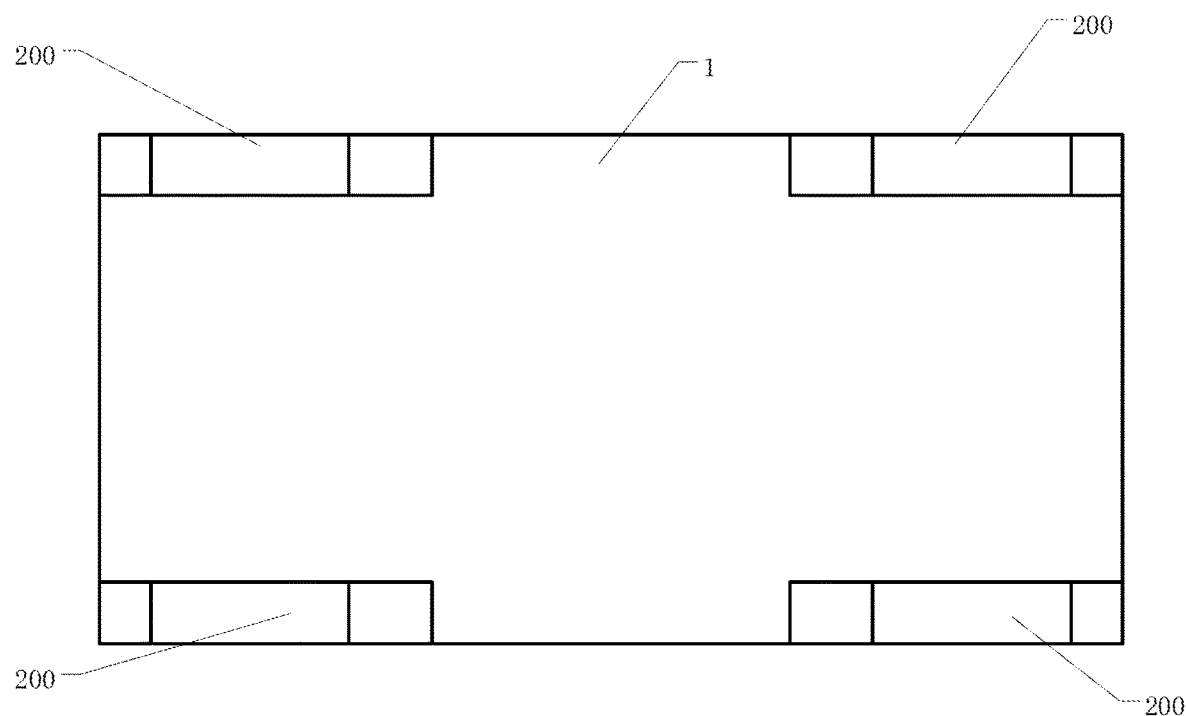
FIG. 9 schematically shows how move-in and move-out units are distributed in accordance with a third embodiment of the present invention.

As shown in FIG. 9, this embodiment differs from Embodiment 1 in that four move-in and move-out units 200 are disposed symmetrically along the move-in and move-out direction for the workpiece stage at the respective four corners of the lower surface of the base frame 1. As such, the workpiece stage can be moved more stably and more safely, with a lower pressure from each of the wheels 42 onto the ground 9. Moreover, tip-over of the workpiece stage can be better prevented and higher safety thereof can be ensured during the move-in and move-out process.

Embodiment 4

Figure 10:
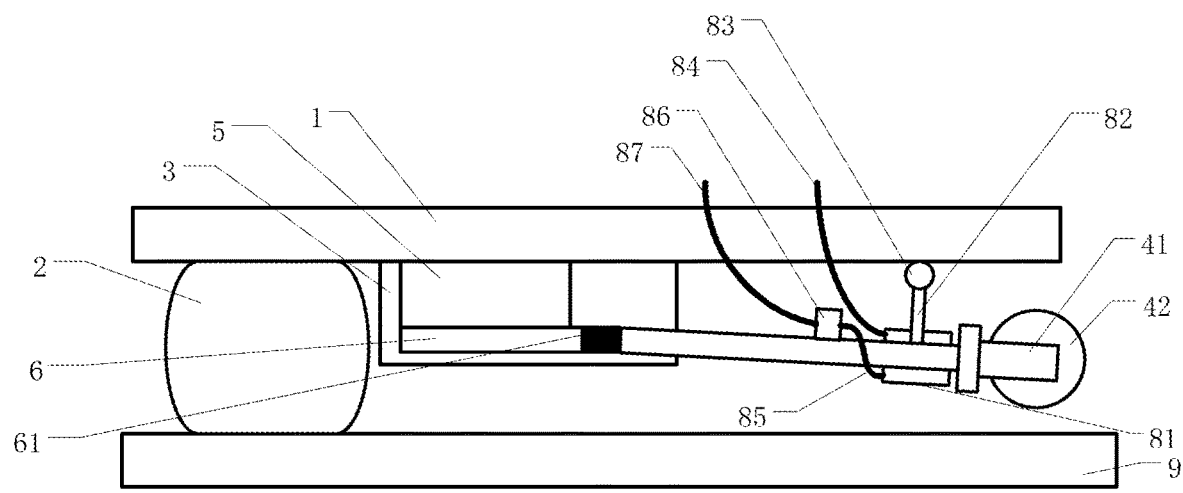
FIG. 10 is a schematic illustration of a device for move-in and move-out of a workpiece stage according to a fourth embodiment of the present invention.

As shown in FIG. 10, this embodiment differs from Embodiment 1 in that the support bracket 88 is omitted and the support bracket 88 is not provided under the urging roller 83. In this case, the advancing pipe 85 is always activated for gas intake so that the urging roller 83 continually presses the base frame 1 and the flat spring 6 maintains the tendency to bend downward. Accordingly, the pneumatic cylinder 81 may be implemented as a single-acting cylinder with only one air intake path, and the device is thus simplified in structure.

In summary, the device for move-in and move-out of a workpiece stage of the present invention includes the base frame 1 for supporting the workpiece stage, the gas spring 2 disposed on the lower surface of the base frame 1, the gas-cushion unit 3 for producing a gas cushion that supports the workpiece stage during movement thereof and the move-in and move-out unit 200 attached to the base frame 1. The move-in and move-out unit 200 includes: the wheel assembly 4 for driving the workpiece stage; the connecting block 5 fixed to the base frame 1; the flat spring 6 coupled to the connecting block 5 at one end and to the wheel assembly 4 at the other end; and the spring deflection assembly 8 which is coupled to the flat spring 6 and configured to deflect the flat spring 6 to bring the wheel assembly 4 into contact with the ground to enable movement of the workpiece stage. The spring deflection assembly 8 in the move-in and move-out unit 200 can deflect the flat spring 6 to bring the wheel assembly 4 into contact with the ground 9 to enable movement of the workpiece stage. After the workpiece stage has moved into place, the wheel assembly 4 can be released from contact with the ground 9 in order to avoid affecting normal operation of the workpiece stage. In this way, jamming will not happen during move-in and move-out of the workpiece stage due to an excessive torque and the workpiece stage can move more stably.

Although a few embodiments of the present invention have been described herein, these embodiments are merely illustrative and are not intended to be construed as limiting the scope of the invention. Various omissions, substitutions and changes made without departing from the spirit of the invention are all intended to be included within the scope thereof.

What is claimed is:

1. A device for move-in and move-out of a workpiece stage, comprising a base frame for supporting the workpiece stage, a gas spring disposed on a lower surface of the base frame, a gas-cushion unit for producing a gas cushion that supports the workpiece stage during movement of the workpiece stage, and a move-in and move-out unit attached to the base frame, the move-in and move-out unit comprising:
    a wheel assembly for driving the workpiece stage to move;
    a connecting block secured to the base frame;
    a flat spring having a first end coupled to the base frame and a second end coupled to the wheel assembly; and
    a spring deflection assembly which is located between the connecting block and the wheel assembly and is coupled to the flat spring;
    wherein the spring deflection assembly comprises a pneumatic cylinder fixed to the flat spring and an urging roller connected to the pneumatic cylinder;
    wherein the urging roller is configured to come into contact with the base frame to transmit a force applied from the urging roller to the base frame, in order to deflect the flat spring to bring the wheel assembly into contact with ground during the movement of the workpiece stage.

2. The device for move-in and move-out of a workpiece stage of claim 1, wherein the wheel assembly comprises a bracket coupled to the second end of the flat spring, a wheel provided on the bracket and a motor connected to the wheel.

3. The device for move-in and move-out of a workpiece stage of claim 1, the first end of the flat spring being coupled to the base frame via the connecting block, wherein a hook block is disposed between the flat spring and the connecting block, the hook block having a base fixed to the flat spring and a top provided with a hook, the hook hooking on the connecting block.

4. The device for move-in and move-out of a workpiece stage of claim 3, wherein the connecting block is provided with a pocket matching the hook, and the hook is received in the pocket.

5. The device for move-in and move-out of a workpiece stage of claim 1, wherein the flat spring has a two-section structure that comprises two sections joined to each other by a flexible hinge.

6. The device for move-in and move-out of a workpiece stage of claim 1, wherein the spring deflection assembly further comprises a retractable piston rod received in the pneumatic cylinder and gas pipes communicating with an interior of the pneumatic cylinder.

7. The device for move-in and move-out of a workpiece stage of claim 6, wherein the gas pipes are provided with a pressure regulator.

8. The device for move-in and move-out of a workpiece stage of claim 6, wherein the urging roller is provided on top of the piston rod.

9. The device for move-in and move-out of a workpiece stage of claim 8, wherein the spring deflection assembly further comprises a support bracket which is fixed to the base frame and configured to support the urging roller.

10. The device for move-in and move-out of a workpiece stage of claim 1, wherein two move-in and move-out units are provided and are arranged along a horizontal line and disposed in symmetry to each other under the base frame along a move-in and move-out direction for the workpiece stage.

11. The device for move-in and move-out of a workpiece stage of claim 1, wherein the move-in and move-out unit is provided on an edge of the base frame in a move-in and move-out direction for the workpiece stage.

12. The device for move-in and move-out of a workpiece stage of claim 1, wherein four move-in and move-out units are provided and disposed symmetrically along a move-in and move-out direction for the workpiece stage at four corners of the lower surface of the base frame.

* * * * *